United States Patent [19]

Ogawa

[11] Patent Number: 5,817,578
[45] Date of Patent: Oct. 6, 1998

[54] METHOD OF CLEANING VACUUM PROCESSING APPARATUS

[75] Inventor: Hiroshi Ogawa, Yamagata, Japan

[73] Assignee: NEC Corporation, Tokyo, Japan

[21] Appl. No.: 648,912

[22] Filed: May 16, 1996

[30] Foreign Application Priority Data

May 24, 1995 [JP] Japan ..................................... 7-124890

[51] Int. Cl.$^6$ ................................................. H01L 21/302
[52] U.S. Cl. ........................ 438/714; 438/725; 438/905; 134/1.1
[58] Field of Search .............................. 134/1.2, 1.3, 1.1; 156/643.1; 438/714, 725, 905

[56] References Cited

U.S. PATENT DOCUMENTS

| | | | |
|---|---|---|---|
| 4,797,178 | 1/1989 | Bui et al. ................................ | 252/79.1 |
| 4,816,113 | 3/1989 | Yamazaki ................................ | 134/1.1 |
| 4,975,144 | 12/1990 | Yamazaki et al. ......................... | 216/81 |
| 5,069,724 | 12/1991 | Kobayashi et al. ........................ | 216/75 |
| 5,356,478 | 10/1994 | Chen et al. .............................. | 134/1.1 |
| 5,417,826 | 5/1995 | Blalock .................................. | 204/176 |
| 5,421,957 | 6/1995 | Carlson et al. ........................... | 216/58 |
| 5,464,031 | 11/1995 | Buley et al. ............................. | 134/1 |
| 5,486,235 | 1/1996 | Ye et al. ................................. | 134/1.1 |
| 5,647,953 | 7/1997 | Williams et al. .................... | 156/643.1 |

*Primary Examiner*—R. Bruce Breneman
*Assistant Examiner*—Anita Alanko
*Attorney, Agent, or Firm*—Foley & Lardner

[57] ABSTRACT

According to a cleaning method of a vacuum processing apparatus, an aluminum film formed on a semiconductor substrate and covered by a resist pattern is etched by a gas containing chlorine radicals in a processing chamber of the vacuum processing apparatus and, after that, a plasma of diluted gases of mixture gases consisting of a gas containing oxygen radicals, a gas containing fluorine radicals, and a gas containing chlorine radicals is generated in the processing chamber, thereby removing residual reaction products.

16 Claims, 1 Drawing Sheet

METHOD OF CLEANING VACUUM PROCESSING APPARATUS

BACKGROUND OF THE INVENTION

1. Field of the Invention

The present invention relates to a cleaning method of a vacuum processing apparatus and, more particularly, to a method of cleaning a processing chamber of a vacuum processing apparatus after a semiconductor substrate was processed by a gas containing chlorine radicals in the processing chamber.

2. Description of Related Art

In a manufacturing step of a semiconductor device, various semiconductor manufacturing apparatuses are used. Some of the semiconductor manufacturing apparatuses have a processing chamber for processing a semiconductor substrate under a vacuum or a reduced pressure. Such an apparatus is called a vacuum processing apparatus. As a vacuum processing apparatus, for example, a dry etching apparatus, a deposition film forming apparatus (PVD apparatus, CVD apparatus, epitaxial growing apparatus), or the like can be mentioned. When the semiconductor substrate is processed in the processing chamber of the vacuum processing apparatus, a residual reaction product is adhered in the processing chamber. To remove the residual reaction product, therefore, it is necessary to clean the inside of the processing chamber.

FIG. 1 shows a dry etching apparatus as an example of the vacuum processing apparatus. The operation of the etching process using the dry etching apparatus will now be described with reference to FIG. 1. In the dry etching apparatus, it is assumed that a $Cl_2$ (chlorine) gas is used as an etching gas and an aluminum film formed on a silicon wafer is dry etched.

First, a silicon wafer 1 in which a resist pattern is formed on the aluminum film is put on a high frequency electrode 3 in a processing chamber 2. Subsequently, the inside of the processing chamber is set to a high vacuum. The $Cl_2$ gas is introduced into the processing chamber 2 from a gas introducing port 4A. In this state, a high frequency from a high frequency generator 8 is applied to the high frequency electrode 3. Thus, chlorine radicals and chlorine ions are generated and are reacted to aluminum, so that the aluminum film is etched. Aluminum chloride produced by the above reaction is exhausted from an exhaust port 5.

In the etching process, a residual reaction product $Al_xC_y\text{-}Cl_z$ (aluminum carbon chloride) is reproduced and is adhered to the high frequency electrode 3, an earth electrode 6, and an inner wall 7 of the processing chamber 2. $C_y$ in the residual reaction product is produced on the basis of carbon C contained in a resist material. When an adhesion amount of the residual reaction product increases, a side etching is promoted or an etching rate of the aluminum film becomes uneven. When such a phenomenon occurs, there is a problem such that good etching characteristics are not obtained and a fraction of the semiconductor devices become defective.

When the atmosphere is introduced into the processing chamber 2, the residual reaction product and the moisture in the atmosphere react, so that hydrogen chloride is generated. Therefore, maintenance work such as the removal of the residual reaction product in the processing chamber 2 cannot be performed for a few hours after the processing chamber 2 was open to atmosphere. There is, consequently, a problem that it takes a long time to perform maintenance of the apparatus. There is also a problem in terms of safety of the worker. Further, there is also a problem such that the dry etching apparatus and its peripheral additional equipment may become rusted.

Various cleaning methods have been considered to solve the various problems as mentioned above. For example, an example of the cleaning method of the etching apparatus has been disclosed in JP-A-61-250185. According to such a method, after completion of the etching, plasma cleaning is performed before the atmosphere is introduced into the processing chamber 2. That is, an oxidizing gas is introduced into the processing chamber 2 from a gas introducing port 4B, and a plasma of the oxidizing gas is generated. Subsequently, a gas containing fluorine radicals is introduced from the gas introducing port 4B, and a plasma of the gas containing the fluorine radicals is generated, thereby plasma cleaning the processing chamber 2. Or, after completion of the etching, plasma cleaning is performed before the atmosphere is introduced into the processing chamber 2. That is, mixture gases of the oxidizing gas and a gas containing fluorine radicals are introduced from the gas introducing port 4B and a plasma of the mixture gases is generated, thereby plasma cleaning the processing chamber. An example of the cleaning method of the deposition film forming apparatus has been disclosed in JP-A-2-138472. According to such a method, the reaction chamber of the deposition film forming apparatus is cleaned by using a plasma of mixture gases of $SF_6$, an oxygen compound, and rare gas.

However, even if any one of the above cleaning methods is used, in the case where the film containing aluminum was processed, it is difficult to perfectly remove the residual reaction products adhered on the inner surface of the processing chamber, high frequency electrode, earth electrode, and the like. The above vacuum processing apparatuses, therefore, have drawbacks such that it takes a long time for the maintenance and the fraction of defective semiconductor devices manufactured by using those vacuum processing apparatuses rises.

SUMMARY OF THE INVENTION

It is an object of the present invention to provide a cleaning method of a vacuum processing apparatus, in which a time that is required for a maintenance of the apparatus can be reduced and the fraction of defective a semiconductor devices which is caused by a residual reaction product can be reduced.

In order to achieve an aspect of the present invention, a method of cleaning a vacuum processing apparatus, includes the steps of:

etching an aluminum film covered by a pattern of resist with a gas containing chlorine radicals in a chamber of a vacuum processing apparatus, the resist containing a carbon component; and generating a plasma of a mixture gas of a gas containing oxygen radicals, a gas containing fluorine radicals, and a gas containing chlorine radicals in the chamber.

The gas containing oxygen radicals preferably is a gas selected from the group consisting of oxygen ($O_2$), ozone ($O_3$), water ($H_2O$), aqueous hydrogen peroxide ($H_2O_2$), carbon oxide ($CO_x$), sulfur oxide ($SO_x$), and nitrogen oxide ($NO_x$). Also, the gas containing fluorine radicals preferably is a gas selected from the group consisting of nitrogen trifluoride ($NF_3$), dicarbon hexafluoride ($C_2F_6$), carbon tetrafluoride ($CF_4$) and sulfur hexafluoride ($SF_6$). Further, the gas containing chlorine radicals preferably is a gas selected from the group consisting of chlorine ($Cl_2$), boron trichloride ($BCl_3$), silicon tetrachloride ($SiCl_4$), and carbon tetrachloride ($CCl_4$). In this case, a ratio of the gas containing oxygen radicals to the mixture gas is in a range of 40% to 60% and is greater than a ratio of the gas containing chlorine radicals to the mixture gas.

The mixture gas may be diluted by a dilution gas. In this case, a mixing ratio of the dilution gas to the diluted gas preferably is in a range of 10% to 80%.

In order to achieve another aspect of the present invention, a method of cleaning a vacuum processing apparatus, includes the steps of:

etching an aluminum film covered by a pattern of resist with a gas containing chlorine radicals in a chamber of a vacuum processing apparatus, the resist containing a carbon component; and generating a plasma of a mixture gas of a gas containing a component reacting to carbon, a gas containing a component reacting to aluminum, and a gas containing a component functioning as a catalyzer in the chamber.

When a plasma of the mixture gases is exposed to the residual reaction product $Al_xC_yCl_z$, aluminum in the residual reaction product reacts with chlorine radicals, so that $AlCl_3$ (aluminum trichloride) is produced, and carbon radicals react to oxygen, so that $CO_2$ (carbon dioxide) is produced. Those $AlCl_3$ and $CO_2$ are exhausted from the processing chamber.

Oxygen ($O_2$) can be used as a gas containing oxygen radicals. Sulfer hexafluoride ($SF_6$) can be used as a gas containing fluorine radicals. Chlorine ($Cl_2$) can be used as a gas containing chlorine radicals. Table 1 shows the results obtained by examining removing effects of the residual reaction products for various mixture ratios of those gases.

TABLE 1

| | Gas flow rate (sccm) | | | |
|---|---|---|---|---|
| No. | ($O_2$) | ($SF_6$) | ($Cl_2$) | Effect |
| 1 | 10 | 10 | 80 | x |
| 2 | 20 | 20 | 60 | x |
| 3 | 30 | 30 | 40 | x |
| 4 | 30 | 30 | 30 | Δ |
| 5 | 40 | 40 | 20 | o |
| 6 | 40 | 30 | 30 | o |
| 7 | 50 | 20 | 30 | o |
| 8 | 60 | 20 | 20 | o |
| 9 | 60 | 0 | 40 | x |
| 10 | 70 | 10 | 20 | Δ |
| 11 | 80 | 10 | 10 | x |

(Notes)
o: Removing effect of the residual reaction products is large.
Δ: Removing effect of the residual reaction products is middle.
x: Removing effect of the residual reaction products is small.

As will be obvious from Table 1, the effect to remove the residual reaction products is recognized in the case where the gas containing the oxygen radicals for the mixture gases lies within a range from about 30 to 70% and the percentage of the gas containing the oxygen radicals for the mixture gases is equal to or larger than the percentage of the gas containing the chlorine radicals and the gas containing the fluorine radicals. Particularly, the effect to remove the residual reaction products is large in the case where the gas containing the oxygen radicals for the mixture gases lies within a range from 40 to 60%. The residual reaction product $Al_xC_yCl_z$ adhered on the inner wall of the processing chamber or the like is dark brown when it is seen by the human eyes. When a plasma of the mixture gases in which the gas containing the oxygen radicals of a volume percentage of 40 to 60% is mixed is exposed for 10 to 20 minutes, the residual reaction product is completely removed from the processing chamber.

It is considered that $O_2$ in the mixture gases is consumed to produce $CO_2$ and $Cl_2$ is consumed to produce $AlCl_3$ and $SF_6$ acts as a catalyst.

The mixture gases can be diluted by a rare earth gas such as He or the like. A plasma of the diluted mixture gases, uniformly reaches everywhere in the processing chamber, so that the residual reaction products are uniformly and effectively removed. When the mixture ratio of the rare earth gas to the diluted gas is equal to or less than 10%, the diluting effect by the rare gas is small and it is difficult to uniformly generate the plasma of the mixture gases. On the other hand, when the mixture ratio of the rare earth gas to the diluted gas is equal to or larger than 80%, the diluting effect by the rare gas is too large and the removing effect of the residual reaction products deteriorates. It is, therefore, preferable that the mixture ratio of the rare earth gas to the diluted gas lies within a range from 10 to 80%.

According to the present invention, since the residual reaction products can be uniformly and effectively removed, good etching characteristics are obtained and the fractional defect of the semiconductor device can be reduced. Since the maintenance of the vacuum processing apparatus can be performed safely in a short time, a working efficiency of the vacuum processing apparatus can be improved.

DESCRIPTION OF THE PREFERRED EMBODIMENTS

Figure 1:
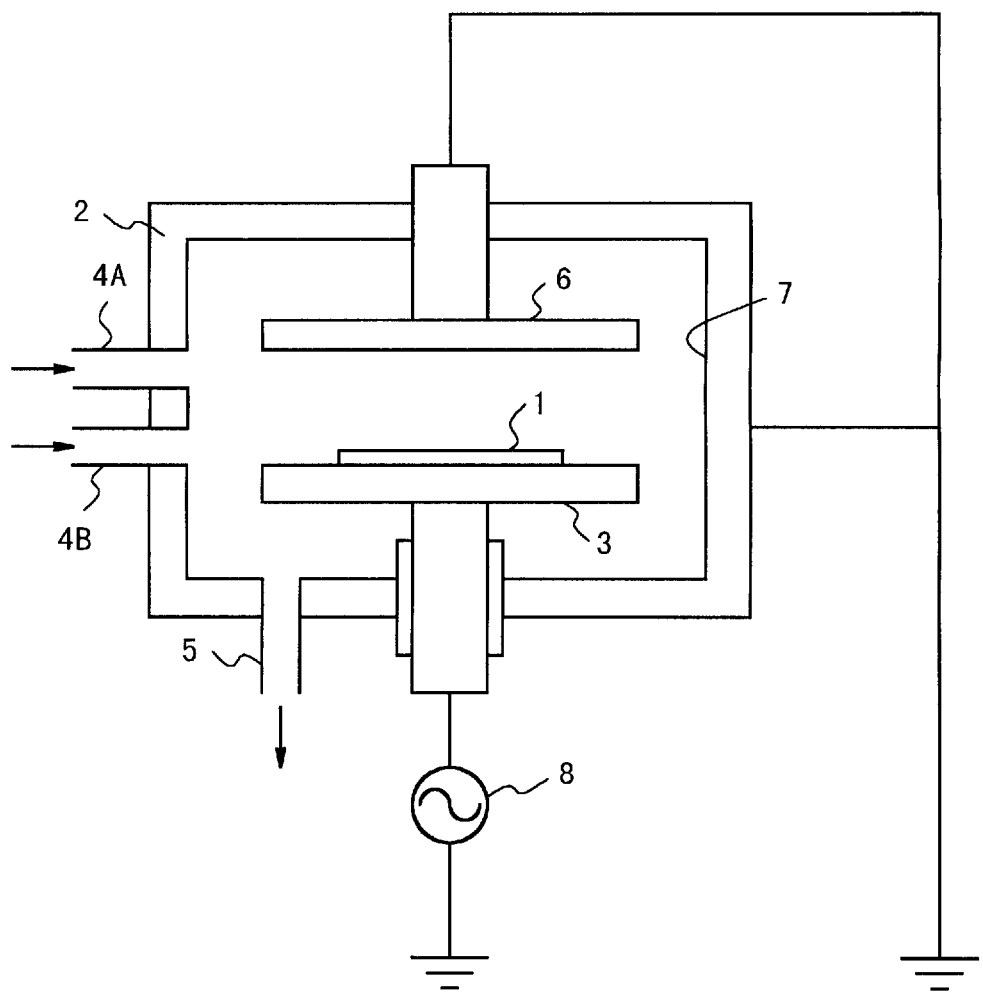
FIG. 1 is a cross sectional view of an etching apparatus for explaining an embodiment of the present invention and a related art.

Embodiments of the present invention will now be described with reference to the drawing. FIG. 1 is a cross sectional view of an etching apparatus for explaining an embodiment of the present invention. The etching apparatus is constructed by: the processing chamber 2 having the gas introducing port 4A for introducing an etching gas, gas introducing port 4B for introducing a cleaning gas, and exhaust port 5; the high frequency electrode 3 and earth electrode 6 provided in the processing chamber 2; and the high frequency generator 8 connected to the high frequency electrode 3.

First as shown in FIG. 1, a thin aluminum film formed on the silicon wafer 1 and covered by a resist pattern is dry etched by a gas containing chlorine radicals. The dry etching operation is the same as the operation of the dry etching apparatus which has been described in the above Related Art. In this embodiment, $Cl_2$ and $BCl_3$ are used as a gas containing the chlorine radicals. The silicon wafer 1 after completion of the dry etching is removed from the processing chamber 2.

A diluted gas formed by diluting the mixture gases by the rare earth gas is introduced into the processing chamber 2 from the gas introducing port 4B, thereby generating a plasma of the diluted gas. The mixture gases are manufactured by using $O_2$ as a gas containing oxygen radicals, $SF_6$ as a gas containing fluorine radicals, and $Cl_2$ as a gas containing chlorine radicals, respectively. He (helium) is used as a rare earth gas. A flow rate of the diluted gas is set to 8~320 sccm for He, 30 sccm for $O_2$, 30 sccm for $SF_6$, and 15 sccm for $Cl_2$, respectively. As conditions for irradiating the plasma, a pressure in the processing chamber is set to 40~300 mTorr, a discharging frequency is set to 13.56 MHz, and a high frequency electric power is set to 100~1000 W, respectively.

After the processing chamber 2 was cleaned by the plasma which had been generated under such conditions, even if the atmosphere was introduced into the processing chamber 2, there is no smell of hydrogen chlorine. Almost of the residual reaction products adhered on each electrode and the inner wall 7 were removed.

According to the embodiment, a maintenance time of the dry etching apparatus which had needed about 12 hours hitherto was reduced to about 30 minutes. Further, since good etching characteristics are obtained, a defect of the semiconductor device which is caused by the etching process is almost eliminated.

In the embodiment, although the residual reaction products have been removed by introducing the diluted gas into the processing chamber, the residual reaction products can be also removed by introducing the mixture gases which are not diluted into the processing chamber. In this case as well, the flow rate of the mixture gases and the plasma irradiating conditions can be set to the same conditions as those in the embodiment.

In the above embodiment, although He has been used as a rare gas, the present invention is not limited to such a gas but another rare earth gas such as Ar, Ne, or the like can be also used. Although $O_2$ has been used as a gas containing the oxygen radicals, in place of it, any one of $O_3$, $H_2O$, $H_2O_2$, $CO_x$, $SO_x$, $NO_x$, and the like can be also used. A combination of two or more among those gases can be also used. Although $SF_6$ has been used as a gas containing the fluorine radicals, in place of it, any one of $NF_3$, $C_2F_6$, $CF_4$ and the like can be also used or a combination of two or more among those gases can be also used. Further, although $Cl_2$ has been used as a gas containing the chlorine radicals has been used, in place of it, any one of $BCl_3$, $SiCl_4$, $CCl_4$, and the like can be also used or a combination of two or more among those gases can be also used. The object of the present invention can be also sufficiently accomplished by such a substitute.

Further, although the cleaning method after the aluminum film was etched has been described in the above embodiment, the cleaning method of the present invention can be also similarly applied to the cleaning after the film containing aluminum was etched. For example, the cleaning method of the present invention can be also similarly applied to the etching of a film of an alloy of aluminum and titanium or a laminated film of aluminum and titanium. In place of titanium, titanium nitride can be also used. In the above cases, titanium reacts to the chlorine radicals, so that $TiCl_x$ (titanium chloride) is produced.

What is claimed is:

1. A method of cleaning a vacuum processing apparatus, comprising the steps of:
   etching an aluminum film covered by a pattern of resist with a gas containing chlorine radicals in a chamber of the vacuum processing apparatus, the resist containing a carbon component; and
   generating a plasma of a mixture gas of a gas containing oxygen radicals, a gas containing fluorine radicals, and a gas containing chlorine radicals in said chamber,
   wherein a ratio of said gas containing oxygen radicals to said mixture gas is in a range of 40% to 60% and is greater than a ratio of said gas containing chlorine radicals to said mixture gas.

2. A method according to claim 1, wherein said gas containing oxygen radicals is a gas selected from the group consisting of oxygen ($O_2$), ozone ($O_3$), water ($H_2O$), aqueous hydrogen peroxide ($H_2O_2$), carbon oxide ($CO_x$), sulfur oxide ($SO_x$), and nitrogen oxide ($NO_x$).

3. A method according to claim 1, wherein said gas containing fluorine radicals is a gas selected from the group consisting of nitrogen trifluoride ($NF_3$), dicarbon hexafluoride ($C_2F_6$), carbon tetrafluoride ($CF_4$) and sulfur hexafluoride ($SF_6$).

4. A method according to claim 1, wherein said gas containing chlorine radicals is a gas selected from the group consisting of chlorine ($Cl_2$), boron trichloride ($BCl_3$), silicon tetrachloride ($SiCl_4$), and carbon tetrachloride ($CCl_4$).

5. A method according to claim 1, wherein said mixture gas further includes a dilution gas.

6. A method according to claim 5, wherein said dilution gas is a rare earth gas.

7. A method according to claim 6, wherein said rare earth gas is selected from the group consisting of helium (He), argon (Ar) and neon (Ne).

8. A method according to claim 5, wherein a ratio of said dilution gas is in a range of 10% to 80%.

9. A method of cleaning a vacuum processing apparatus, comprising of steps of:
   etching an aluminum film covered by a pattern of resist with a gas containing chlorine radicals in a chamber of a vacuum processing apparatus, the resist containing a carbon component; and
   generating a plasma of a mixture gas of a gas containing a component reacting to carbon, a gas containing a component reacting to aluminum, and a gas containing a component functioning as a catalyzer in said chamber,
   wherein a ratio of said gas containing a component reacting to carbon to said mixture gas is in range of 40% to 60% and is greater than a ratio of said gas containing a component reacting to aluminum to said mixture gas.

10. A method according to claim 9, wherein said gas containing a component reacting to carbon is a gas selected from the group consisting of oxygen ($O_2$), ozone ($O_3$), water ($H_2O$), aqueous hydrogen peroxide ($H_2O_2$), carbon oxide ($CO_x$), sulfur oxide ($SO_x$), and nitrogen oxide ($NO_x$).

11. A method according to claim 11, wherein said gas containing a component functioning a catalyzer is a gas selected from the group consisting of nitrogen trifluoride ($NF_3$), dicarbon hexafluoride ($C_2F_6$), carbon tetrafluoride ($CF_4$) and sulfur hexafluoride ($SF_6$).

12. A method according to claim 9, wherein said gas containing a component reacting to aluminum is a gas selected from the group consisting of chlorine ($Cl_2$), boron trichloride ($BCl_3$), silicon tetrachloride ($SiCl_4$), and carbon tetrachloride ($CCl_4$).

13. A method according to claim 9, wherein said mixture gas further includes a dilution gas.

14. A method according to claim 13, wherein said dilution gas is a rare earth gas.

15. A method according to claim 14, wherein said rare earth gas is selected from the group consisting of helium (He), argon (Ar) and neon (Ne).

16. A method according to claim 13, wherein a ratio of said dilution gas to said diluted gas is in a range of 10% to 80%.

* * * * *

UNITED STATES PATENT AND TRADEMARK OFFICE
CERTIFICATE OF CORRECTION

PATENT NO.   : 5,817,578
DATED        : October 6, 1998
INVENTOR(S)  : Hiroshi Ogawa It is certified that error appears in the above-identified patent and that said Letters Patent is hereby corrected as shown below:

Column 4,
At each of lines, 7,11,15,19,58, and 64 delete "rare earth gas" and insert -- rare gas --.

Column 5,
Line 26, delete "rare earth gas" and insert -- rare gas --.

Column 6,
Lines 18,19-20, and 58-60, delete "rare earth gas" and insert -- rare gas --.

Claim 11,
Change "A method according to claim 11," to -- A method according to claim 10, --.

Signed and Sealed this

Twenty-third Day of October, 2001

Attest:

NICHOLAS P. GODICI
Attesting Officer    Acting Director of the United States Patent and Trademark Office